(12) United States Patent
Oh et al.

(10) Patent No.: US 7,934,140 B2
(45) Date of Patent: Apr. 26, 2011

(54) METHOD OF ENCODING AND DECODING USING LDPC CODE

(75) Inventors: Min Seok Oh, Seoul (KR); Kyu Hyuk Chung, Seoul (KR)

(73) Assignee: LG Electronics Inc., Seoul (KR)

( * ) Notice: Subject to any disclaimer, the term of this patent is extended or adjusted under 35 U.S.C. 154(b) by 763 days.

(21) Appl. No.: 11/575,492

(22) PCT Filed: Sep. 16, 2005

(86) PCT No.: PCT/KR2005/003103
§ 371 (c)(1),
(2), (4) Date: Jan. 24, 2008

(87) PCT Pub. No.: WO2006/031092
PCT Pub. Date: Mar. 23, 2006

(65) Prior Publication Data
US 2009/0132886 A1    May 21, 2009

(30) Foreign Application Priority Data

Sep. 17, 2004 (KR) .................. 10-2004-0074764
Oct. 27, 2004 (KR) .................. 10-2004-0086320

(51) Int. Cl.
*H03M 13/00* (2006.01)
(52) U.S. Cl. ............................................. 714/752

(58) Field of Classification Search ........... 715/752; 714/752
See application file for complete search history.

(56) References Cited

U.S. PATENT DOCUMENTS

| 7,058,873 B2 * | 6/2006 | Song et al. ............. 714/752 |
| 2003/0037298 A1 * | 2/2003 | Eleftheriou et al. ....... 714/752 |
| 2004/0148560 A1 | 7/2004 | Hocevar |
| 2008/0163027 A1 * | 7/2008 | Richardson et al. ........ 714/758 |

FOREIGN PATENT DOCUMENTS

| EP | 1443656 A2 | 8/2004 |
| EP | 1511177 A2 | 3/2005 |

* cited by examiner

*Primary Examiner* — Scott T Baderman
*Assistant Examiner* — Enam Ahmed
(74) *Attorney, Agent, or Firm* — Lee, Hong, Degerman, Kang & Waimey

(57) ABSTRACT

A method of encoding/decoding using an LDPC code is disclosed, by which performance is enhanced and by which complexity is reduced. In encoding/decoding using an LDPC code defined by an $(n-k) \times n$ parity check matrix H, the present invention includes the step of performing the encoding/decoding input source data using the parity check matrix H including $H_p$ and $H_d$ to meet $H=[H_d|H_p]$ (where $H_d$ has $(n-k) \times k$ dimensions, $H_p$ has $(n-k) \times (n-k)$ dimensions), wherein if the $H_p$ comprises a plurality of $z \times z$ sub-matrices, each of the sub-matrices is an identity matrix or a zero matrix and wherein a column weight of each column of the $H_p$ is at least 2.

11 Claims, 6 Drawing Sheets

FIG. 1

$$H = \begin{bmatrix} P_{0,0} & P_{0,1} & P_{0,2} & \cdots & P_{0,n_b-2} & P_{0,n_b-2} \\ P_{1,0} & P_{1,1} & P_{1,2} & \cdots & P_{1,n_b-2} & P_{1,n_b-1} \\ P_{2,0} & P_{2,1} & P_{2,2} & \cdots & P_{2,n_b-2} & P_{2,n_b-1} \\ \vdots & \vdots & \vdots & \cdots & \vdots & \vdots \\ P_{m_b-1,0} & P_{m_b-1,1} & P_{m_b-1,2} & \cdots & P_{m_b-1,n_b-2} & P_{m_b-1,n_b-1} \end{bmatrix} = P^{H_b}$$

FIG. 2

$$\left\{ \begin{array}{cccccccc|cccccccc} 1 & 2 & 0 & 3 & 4 & 5 & 0 & 1 & 1 & 0 & 0 & 0 & 0 & 0 & 0 & 0 \\ 4 & 3 & 1 & 5 & 2 & 1 & 5 & 2 & 1 & 1 & 0 & 0 & 0 & 0 & 0 & 0 \\ 1 & 5 & 1 & 3 & 1 & 0 & 3 & 4 & 0 & 1 & 1 & 0 & 0 & 0 & 0 & 0 \\ 0 & 2 & 1 & 2 & 0 & 4 & 1 & 1 & 0 & 0 & 1 & 1 & 0 & 0 & 0 & 0 \\ 3 & 5 & 0 & 1 & 2 & 2 & 3 & 4 & 0 & 0 & 0 & 1 & 1 & 0 & 0 & 0 \\ 3 & 2 & 3 & 4 & 0 & 1 & 2 & 3 & 0 & 0 & 0 & 0 & 1 & 1 & 0 & 0 \\ 0 & 4 & 5 & 2 & 4 & 3 & 4 & 1 & 0 & 0 & 0 & 0 & 0 & 1 & 1 & 0 \\ 5 & 2 & 4 & 1 & 3 & 0 & 2 & 0 & 0 & 0 & 0 & 0 & 0 & 0 & 1 & 1 \end{array} \right\}$$

$$\left[ (H_b)_d \; \middle| \; \begin{array}{cccccccc} I & 0 & 0 & 0 & 0 & 0 & 0 & 0 \\ I & I & 0 & 0 & 0 & 0 & 0 & 0 \\ 0 & I & I & 0 & 0 & 0 & 0 & 0 \\ 0 & 0 & I & I & 0 & 0 & 0 & 0 \\ 0 & 0 & 0 & I & I & 0 & 0 & 0 \\ 0 & 0 & 0 & 0 & I & I & 90 & I \\ 0 & 0 & 0 & 0 & 0 & I & I & 0 \\ 0 & 0 & 0 & 0 & 0 & 0 & I & I \end{array} \right]$$

$H_b \qquad (H_b)_p$

FIG. 6

$$\left[ (H_b)_d \; \middle| \; \begin{array}{cccccccc} I & I & 0 & 0 & 0 & 0 & 0 & 0 \\ I & 0 & I & 0 & 0 & 0 & 0 & 0 \\ 90 & I & I & I & 0 & 0 & 0 & 0 \\ 0 & 0 & 0 & I & I & 0 & 0 & 0 \\ 0 & 0 & 0 & 0 & I & I & 0 & 0 \\ 0 & 0 & 0 & 0 & 0 & I & I & 0 \\ 0 & 0 & 0 & 0 & 0 & 0 & I & I \\ 0 & 0 & 0 & 0 & 0 & 0 & 0 & I \end{array} \right]$$

$H_b \qquad (H_b)_p$

– 1 –

METHOD OF ENCODING AND DECODING USING LDPC CODE

TECHNICAL FIELD

The present invention relates to an encoding/decoding method, and more particularly, to a method of encoding/decoding using an LDPC code. Although the present invention is suitable for a wide scope of applications, it is particularly suitable for enhancing performance and for reducing complexity.

BACKGROUND ART

Generally, encoding is a process that a transmitting side performs a data processing for a receiving side to restore original data despite errors caused by signal distortion, loss and the like while the transmitting side transmits data via a communication channel. And, decoding is a process that the receiving side restores the encoded transmitted data into the original data.

Recently, many attentions are paid to an encoding method using an LDPC code. The LDPC code is a linear block code having low density since most of elements of a parity check matrix H are zeros, which was proposed by Gallager in 1962. It was difficult to implement the LDPC code that is very complicated due to the technological difficulty in those days. Yet, the LDPC code was taken into re-consideration in 1995 so that its superior performance has been verified. So, many efforts are made to research and develop the LPDC code. (Reference: [1] Robert G. Gallager, "Low-Density Parity-Check Codes", The MIT Press, Sep. 15, 1963. [2] D. J. C. Mackay, Good error-correcting codes based on very sparse matrices, IEEE Trans. Inform. Theory, IT-45, pp. 399-431 (1999))

Since the number of 1s of the parity check matrix of the LDPC code is very small, decoding of the parity check matrix of the LDPC is enabled through repetition decoding in case of a large block size. If the block size becomes considerably large, the parity check matrix of the LDPC code shows the performance that approximates a channel capacity limit of Shannon like a turbo code.

The LDPC code can be explained by a (n–k)×n parity check matrix H. And, a generator matrix G corresponding to the parity check matrix H can be found by Equation 1.

$$H \cdot G = 0 \qquad \text{[Equation 1]}$$

In an encoding/decoding method using an LDPC code, a transmitting side encodes input data by Equation 2 using the generator matrix G having a relation of Equation 1 with the parity check matrix H.

$x = G \cdot s$, where 'x' is a codeword and 's' is inputted source data. [Equation 2]

Lately, a method of encoding input data using the parity check matrix H is globally used instead of the generator matrix G. Hence, as mentioned in the foregoing description, the parity check matrix H is the most important element in the encoding method using the LDPC code.

The parity check matrix H, as shown in FIG. 1, is configured with a plurality of z×z permutation matrices or a zero matrix. Namely, $P_{ij}$ in FIG. 1 means the z×z permutation matrix or zero matrix.

A plurality of the permutation matrices can be formed by permutating at least one base permutation matrix according to a predetermined regularity. For instance, if a base permutation matrix is set to a z×z identity matrix, a plurality of permutation matrices can be generated from shifting all rows of the base permutation matrix in a specific direction by a predetermined interval, exchanging a specific row (or column) of the base permutation matrix for another random row (or column) of the base permutation matrix, rotating the base permutation matrix by a predetermined angle or the like.

Instead of expressing a plurality of the permutation matrices configuring the party check matrix H as a matrix, by previously determining types of a plurality of the permutation matrices according to the method or class of permutating the base permutation matrix, it is able to express the parity check matrix H as the types of a plurality of the permutation matrices. In the following description, the parity check matrix H expressed as the types of a plurality of the permutation matrices is defined as a base matrix $H_b$ to use. The base matrix $H_b$ has $m_b \times n_b$ dimensions. In this case, $m_b = (n-k)/z$ and $n_b = n/z$. And, the parity check matrix H can be generated in a manner of replacing information (hereinafter called a permutation type) of the type of the permutation matrix corresponding to each element of the base matrix $H_b$ by a permutation matrix corresponding to the permutation type and expanding the corresponding permutation matrix.

FIG. 2 is a diagram of an example of the base matrix $H_b$.

Referring to FIG. 2, a 5×5 identity matrix is used as a base permutation matrix. A plurality of permutation matrices are generated from shifting all rows of the base permutation matrix in a specific direction by a predetermined interval. In doing so, the permutation type of the base permutation matrix as the 5×5 identity matrix is set to '1', the permutation type of the permutation matrix generated from shifting all rows of the base permutation matrix by one row is set to '2', the permutation type of the permutation matrix generated from shifting all rows of the base permutation matrix by two rows is set to '3', the permutation type of the permutation matrix generated from shifting all rows of the base permutation matrix by three row is set to '4', and the permutation type of the permutation matrix generated from shifting all rows of the base permutation matrix by five rows is set to '5'. Thus, the parity check matrix H is expressed as the permutation types. In FIG. 2, '0' means a 5×5 zero matrix. IF the parity check matrix H is expressed as the permutation types, it is able to save the memory for storing the parity check matrix H. In FIG. 2, the permutation type is exemplarily expressed as an integer. Yet, the permutation type can be expresses in various ways.

Assuming that the base matrix $H_b$ is divided into two parts $(H_b)_d$ and $(H_b)_p$, the part $(H_b)_p$ can employ a block dual diagonal matrix as shown in FIG. 2. In the block dual diagonal matrix, a main diagonal and a diagonal beneath or directly above the main diagonal include identity matrices and the rest include zero matrices.

In case of using the block dual diagonal matrix as the part $(H_b)_p$, a plurality of columns each having a weight of 1 is generated in the parity check matrix H. Namely, as a last column of the part $(H_b)_p$ is configured with one 5×5 identity matrix and a 5×5 zero matrix, five columns each having the weight of 1 are generated in aspect of the parity check matrix H. In the substantial encoding/decoding method using the LDPC code, since a matrix having dimensions considerably greater than the 5×5 dimensions is used as the base permutation matrix, the parity check matrix H includes more columns each having the weight of 1 than the example of FIG. 2. Hence, the operations for the encoding/decoding are complicated to considerably degrade encoding/decoding performance.

DISCLOSURE OF THE INVENTION

Accordingly, the present invention is directed to a method of encoding/decoding using an LDPC code that substantially obviates one or more of the problems due to limitations and disadvantages of the related art.

An object of the present invention is to provide a method of encoding/decoding using an LDPC code, by which encoding/decoding performance is enhanced and complexity is reduced.

In case that a base matrix $H_b$ includes two parts $(H_b)_d$ and $(H_b)_p$ and in case that the part $(H_b)_p$ employs a block dual diagonal matrix, the present invention is characterized in that there is no a column having a weight of 1 in $H_p$ of a parity check matrix H.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, a method of encoding using an LDPC code, which is defined by an (n−k)×n parity check matrix H, according to the present invention includes the step of encoding input source data using the parity check matrix H including $H_p$ and $H_d$ to meet H=[$H_d$|$H_p$] (where $H_d$ has (n−k)×k dimensions, $H_p$ has (n−k)×(n−k) dimensions), wherein if the $H_p$ comprises a plurality of z×z sub-matrices, each of the sub-matrices is an identity matrix or a zero matrix and wherein a column weight of each column of the $H_p$ is at least 2.

To further achieve these and other advantages and in accordance with the purpose of the present invention, a method of decoding using an LDPC code, which is defined by an (n−k)×n parity check matrix H, includes the step of decoding input source data using the parity check matrix H including $H_p$ and $H_d$ to meet H=[$H_d$|$H_p$](where $H_d$ has (n−k)×k dimensions, $H_p$ has (n−k)×(n−k) dimensions), wherein if the $H_p$ comprises a plurality of z×z sub-matrices, each of the sub-matrices is an identity matrix or a zero matrix and wherein a column weight of each column of the $H_p$ is at least 2.

To further achieve these and other advantages and in accordance with the purpose of the present invention, in a parity sequence including $m_b$ parity column vector groups of z-bit number unit using a z×z parity check matrix H including H-matrix elements of a z×z permutation matrix or a zero matrix with an input data sequence s including $k_b$ data column vectors of z-bit number unit, a method of encoding using an LDPC code includes the steps of finding a parity vector p(0) using the H-matrix elements and the data column vectors and sequentially finding parity vectors p(1) to p($m_b$−1) by at least one determined recursion Equation using the first parity column vector p(0), the data column vectors and the H-matrix elements, wherein the n is a length of the input data sequence, wherein the m is a parity bit sequence length, and wherein k=n−m.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a diagram of a parity check matrix H including a plurality of z×z permutation matrices or a zero matrix;

FIG. 2 is a diagram of an example of the base matrix $H_b$;

FIG. 5 is an exemplary diagram of a structure of a parity check matrix H shown in a format of a base matrix $H_b$ according to another preferred embodiment of the present invention;

FIG. 6 is an exemplary diagram of a structure of a parity check matrix H shown in a format of a base matrix $H_b$ according to another preferred embodiment of the present invention;

BEST MODE FOR CARRYING OUT THE INVENTION

Reference will now be made in detail to the preferred embodiments of the present invention, examples of which are illustrated in the accompanying drawings.

Figure 3:
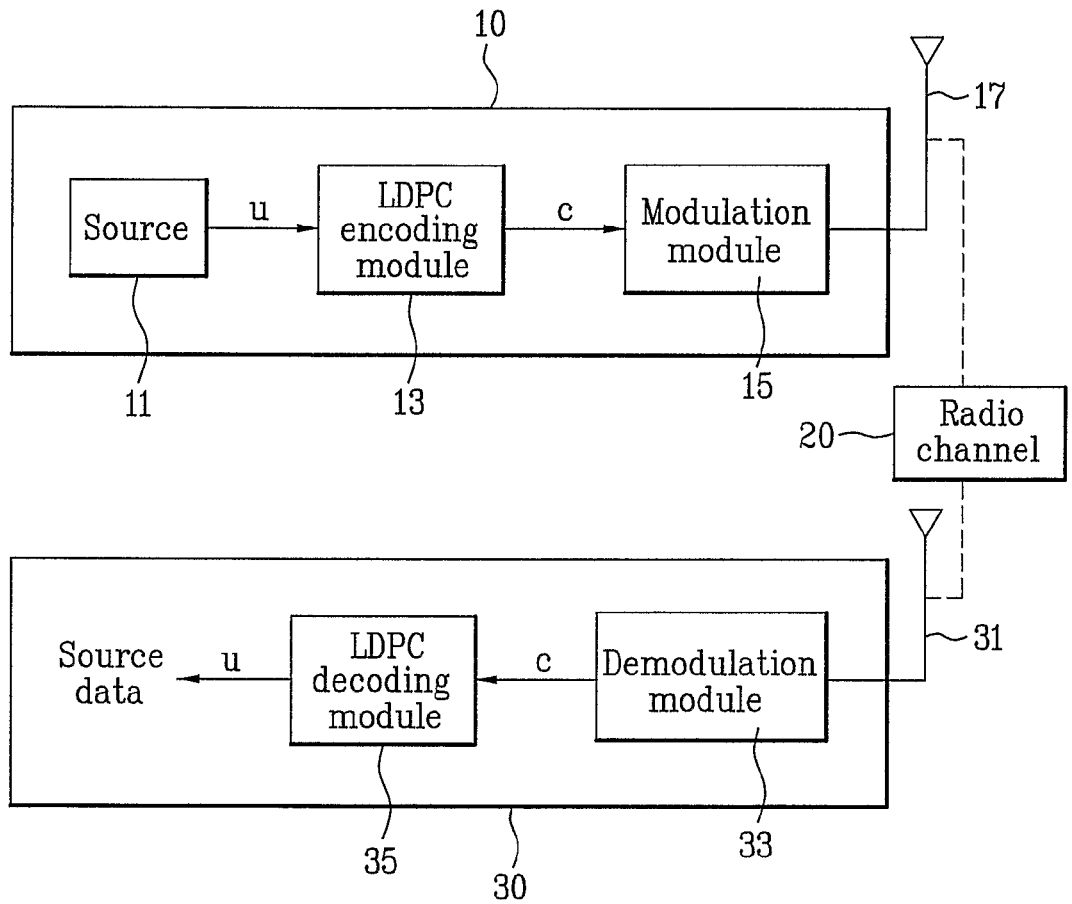
FIG. 3 is a block diagram of a communication system for explaining one preferred embodiment of the present invention.

FIG. 3 is a block diagram of a communication system to explain one preferred embodiment of the present invention, in which a technical feature of the present invention is applied to a wireless communication system for example.

Referring to FIG. 3, a transmitter 10 and a receiver 30 communicate with each other using a radio channel as a medium. In the transmitter 10, a k-bit source data u outputted from a data source 11 is converted to an n-bit codeword c by LDPC encoding conducted by an LDPC encoding module 13. The codeword c is radio-modulated by a modulation module 15 to be transmitted by an antenna 17 via the radio channel 20 and is then received by another antenna 31 of the receiver 30. The receiver 30 goes through a process reverse to that of the transmitter 10. Namely, the received data is demodulated by a demodulation module 33 to be decoded by an LDPC decoding module 35, whereby the source data u can be finally obtained. The above explained data transmitting/receiving process is described within a minimum range required for explaining the features of the present invention. So, it is apparent to those skilled in the art that the corresponding process needs more procedures for the data transmission/reception.

The parity check matrix H used in encoding the input source data in the LDPC encoding module 13 is (n−k)×n dimensional. The 'k' means a length (bit unit) of the input data inputted to the LDPC encoding module 13. The 'n' means a length (bit unit) of the encoded codeword c. The parity check matrix H, as shown in FIG. 1, is configured with a plurality of z×z permutation matrices or a zero matrix.

As mentioned in the foregoing description, the parity check matrix H can be expressed as a base matrix $H_b$ including permutation types of a base permutation matrix and a plurality of permutation matrices generated from permutating the base permutation matrix according to a predetermined regularity or rule. Assuming that the base matrix $H_b$ is divided into two parts $(H_b)_d$ and $(H_b)_p$, the part $(H_b)_p$ includes a block dual diagonal matrix in general, which causes the problem of performance degradation in encoding or decoding. To solve the related art problem, the present invention is characterized in configuring the part $H_p$ in a manner different from that of the related art.

Figure 4:
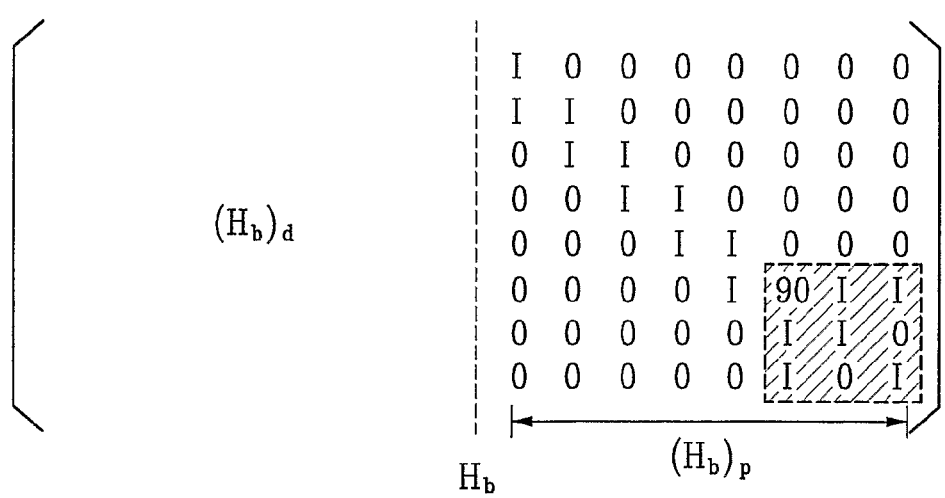
FIG. 4 is an exemplary diagram of a structure of a parity check matrix H shown in a format of a base matrix $H_b$ according to one preferred embodiment of the present invention.

FIG. 4 is an exemplary diagram of a structure of a parity check matrix H shown in a format of a base matrix $H_b$ according to one preferred embodiment of the present invention.

Referring to FIG. 4, 'I' corresponds to a z×z identity matrix, '0' is a z×z zero matrix, and '90' indicates a matrix generated from rotating the identity matrix by 90°. Comparing the part $(H_b)_p$ of FIG. 4 to the part $(H_b)_p$ Of FIG. 2, there is a structural difference in a 3×3 portion (indicated by hatching in FIG. 4) at its right lower corner.

The reason why the structure of $(H_b)_p$ is transformed into that in FIG. 4 is explained as follows.

First of all, by completely eliminating a column having a weight of 1 from the parity check matrix H, the performance in encoding or decoding is raised.

Secondly, the parity check matrix H is made to avoid a 4-cycle overall and a 6-cycle is made equal to or smaller than a preset critical value ($C_{max}$) in the entire parity check matrix H. The 4-cycle means a case that two random rows of the parity check matrix H have 1's at two points simultaneously. And, the 4-cycle causes the degradation of the encoding or decoding performance. The 6-cycle means a case that all two combinable rows selected from three random rows of the parity check matrix H have 1's at the same points, respectively.

Thirdly, a matrix generated from rotating the identity matrix by 90° is added, whereby a plurality of linearly dependent rows are prevented from being generated to assist a HARQ (hybrid auto retransmission request) operation, and more particularly, an IR (incremental redundancy) operation. If the plurality of linearly dependent rows are generated, it is unable to find solutions of equations for the encoding or decoding. Hence, an unnecessary calculation amount is raised in the encoding and the performance is degraded in the decoding.

In the encoding method using the LDPC code, the input source data can be encoded using the generator matrix G. Namely, a k-bit input source data $s_{1 \times k}$ is encoded into an n-bit codeword $x_{1 \times k}$ by Equation 2. A codeword x has a configuration of $x=[s\ p]=[s_0, s_1, \ldots, s_{k-1}, p_0, p_1, \ldots, p_{m-1}]$, where $(p_0, p_1, \ldots, p_{m-1})$ are parity check bits and $(s_0, s_1, \ldots, s_{k-1})$ are systematic bits.

The encoding scheme using the generator matrix G is very complicated. To reduce such complexity, it is preferable that the input source data is directly encoded using the parity check matrix H.

The input source data $s=(s_o, \ldots, s_{k-1})$ can be divided into z-bit $k_b$ ($k_b=n_b-m_b$) column vectors such as $s(i)=[s_{iz}, s_{iz+1} \ldots s_{(i+1)z-1}]^T$. And, the parity check bit $p=(p_o, \ldots, p_{k-1})$ can be divided into $m_b$ column vectors such as $p(i)=[p_{iz}, p_{iz+1} \ldots p_{(i+1)z-1}]^T$.

The encoding scheme using the parity check matrix H shown in FIG. 4 is carried out by two procedures of recursion and finalization.

The recursion procedure is to determine p(i), which can be expressed as Equation 3.

$$p(i) = p(i-1) + \sum_{j=0}^{k_b-1} P_{i,j} s(j), \quad \text{[Equation 3]}$$

$$i = 0, 1, \ldots, m_b - 4, \text{ where } p(-1) \equiv 0_{z \times 1}$$

Figure 7:
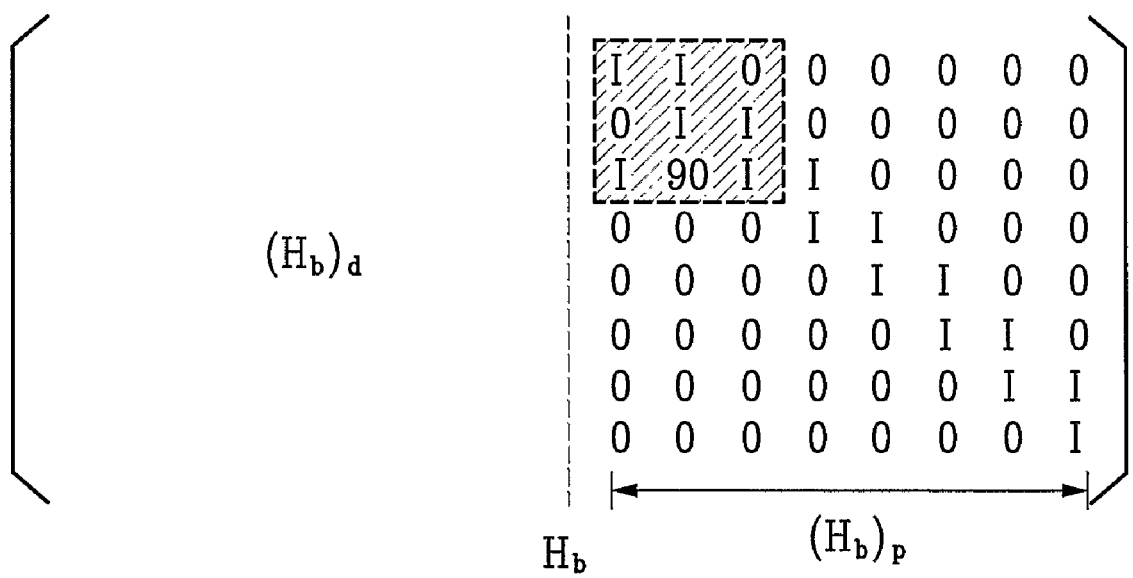
FIG. 7 is an exemplary diagram of a structure of a parity check matrix H shown in a format of a base matrix $H_b$ according to another preferred embodiment of the present invention.

Equation 3 explains a process of sequentially obtaining a first parity vectors p(0) to a parity vectors $p(m_b-4)$ corresponding to a fourth one from the last through simple recursive calculations. And, it is able to start from a parity vector $p(m_b-1)$ according to a permutation form of $(H_b)_p$ as shown in FIGS. 5 to 7. In the scheme of Equation 3, an initialization procedure is not needed to be advantageous in case of transmitting an initial parity vector part not to transmit the rest parts (e.g., puncturing, H-ARQ, IR operation).

The finalization procedure is to find $p(m_b-3)$, $p(m_b-2)$ and $p(m_b-1)$, which can be expressed as Equation 4.

$$P_{m_b-3, n_b-3} p(m_b - 3) = p(m_b - 4) + \sum_{i=m_b-3}^{m_b-1} \sum_{j=0}^{k_b-1} P_{i,j} s(j), \quad \text{[Equation 4]}$$

$$p(i) = p(m_b - 3) + \sum_{j=0}^{k_b-1} P_{i,j} s(j),$$

$$i = m_b - 2, m_b - 1$$

Equation 4, which is a procedure for obtaining three last parity vectors, is generated due to an identity matrix added to eliminate a plurality of columns each having a weight of 1 in the related art. The three last parity vectors can be obtained through this procedure to finalize the encoding.

FIG. 5 is an exemplary diagram of a structure of a parity check matrix H shown in a format of a base matrix $H_b$ according to another preferred embodiment of the present invention.

Referring to FIG. 5, $(H_b)_p$ has a structure that second and third columns from a right end are mutually switched in the $(H_b)_p$ shown in FIG. 4. The structure of FIG. 5 is provided due to the same reasons for the structure of FIG. 4. An encoding process using a base matrix $H_b$ shown in FIG. 5 is carried out by two procedures of recursion and finalization.

The recursion procedure is to determine p(i) from p(i−1), which can be expressed as Equation 5.

$$p(i) = p(i-1) + \sum_{j=0}^{k_b-1} P_{i,j} s(j), \quad \text{[Equation 5]}$$

$$i = 0, 1, \ldots, m_b - 4,$$

$$\text{where } p(-1) \equiv 0_{z \times 1}$$

The finalization procedure is to find $p(m_b-3)$, $p(m_b-2)$ and $p(m_b-1)$, which can be expressed as Equation 6.

$$P_{m_b-3, n_b-2} p(m_b - 2) = p(m_b - 4) + \sum_{i=m_b-3}^{m_b-1} \sum_{j=0}^{k_b-1} P_{i,j} s(j), \quad \text{[Equation 6]}$$

$$p(i) = p(m_b - 2) + \sum_{j=0}^{k_b-1} P_{i,j} s(j),$$

$$i = m_b - 3, m_b - 1$$

The meanings of Equation 5 and Equation 6 are similar to those of Equation 3 and Equation 4.

FIG. 6 is an exemplary diagram of a structure of a parity check matrix H shown in a format of a base matrix $H_b$ according to another preferred embodiment of the present invention. Comparing $(H_b)_p$ of FIG. 6 to $(H_b)_p$ of FIG. 2, there exists a difference in the structure of a 3×3 part at an upper left corner (indicated by hatching in FIG. 6). The structure of FIG. 6 is provided due to the same reasons for the structure of FIG. 4.

An encoding process using a base matrix $H_b$ shown in FIG. 6 is carried out by two procedures of recursion and finalization.

The recursion procedure is to determine $p(i-1)$ from $p(i)$, which can be expressed as Equation 7.

$$p(i-1) = p(i) + \sum_{j=0}^{k_b-1} P_{i,j} s(j), \quad \text{[Equation 7]}$$

$$i = 4, 5, \ldots, m_b,$$

$$\text{where } p(m_b) \equiv 0_{z \times 1}$$

The finalization procedure is to find $p(0)$, $p(1)$ and $p(2)$, which can be expressed as Equation 8.

$$P_{2,0}\, p(0) = p(3) + \sum_{i=0}^{2} \sum_{j=0}^{k_b-1} P_{i,j} s(j), \quad \text{[Equation 8]}$$

$$p(i) = p(0) + \sum_{j=0}^{k_b-1} P_{i,j} s(j),$$

$$i = 1, 2$$

The applications in Equation 7 and Equation 8 can be approached in the same manners of Equation 3 and Equation 4.

FIG. 7 is an exemplary diagram of a structure of a parity check matrix H shown in a format of a base matrix $H_b$ according to another preferred embodiment of the present invention.

Referring to FIG. 7, $(H_b)_p$ has a structure that second and third columns from a right end are mutually switched in the $(H_b)_p$ shown in FIG. 6. The structure of FIG. 7 is provided due to the same reasons for the structure of FIG. 4. An encoding process using a base matrix $H_b$ shown in FIG. 7 is carried out by two procedures of recursion and finalization.

The recursion procedure is to determine $p(i-1)$ from $p(i)$, which can be expressed as Equation 9.

$$p(i-1) = p(i) + \sum_{j=0}^{k_b-1} P_{i,j} s(j), \quad \text{[Equation 9]}$$

$$i = 4, 5, \ldots, m_b,$$

$$\text{where } p(m_b) \equiv 0_{z \times 1}$$

The finalization procedure is to find $p(0)$, $p(1)$ and $p(2)$, which can be expressed as Equation 10.

$$P_{3,2}\, p(1) = p(3) + \sum_{i=0}^{2} \sum_{j=0}^{k_b-1} P_{i,j} s(j), \quad \text{[Equation 10]}$$

$$p(i) = p(1) + \sum_{j=0}^{k_b-1} P_{i,j} s(j),$$

$$i = 0, 3$$

The meanings of Equation 9 and Equation 10 are similar to those of Equation 3 and Equation 4.

Figure 8:
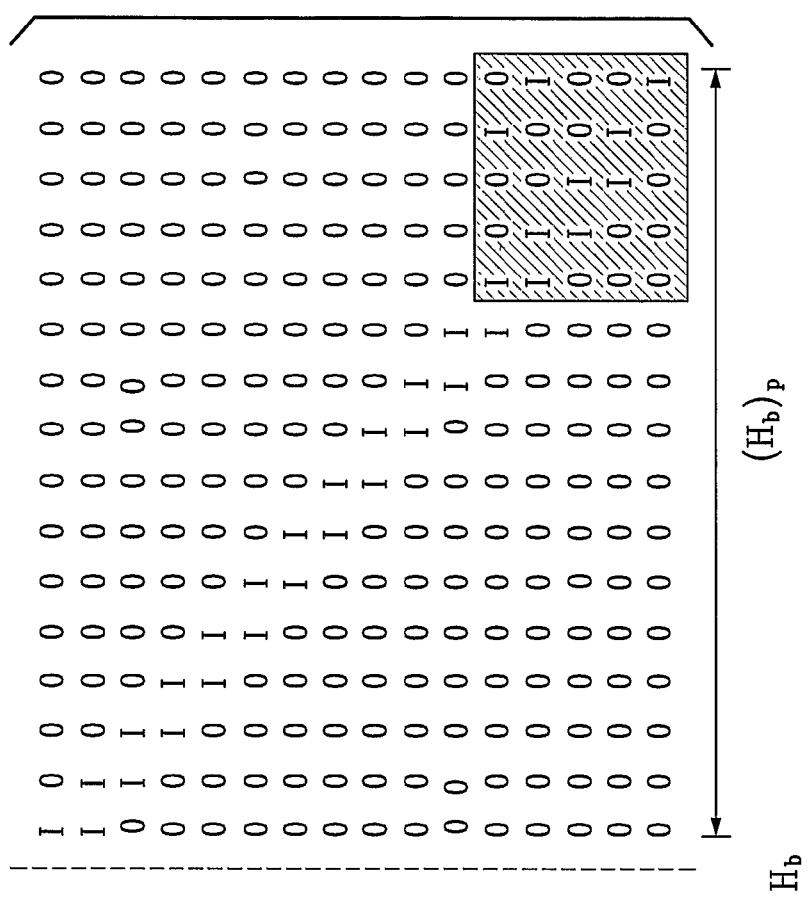
FIG. 8 is an exemplary diagram of a structure of a parity check matrix H expressed as a format of a base matrix $H_b$ according to another preferred embodiment of the present invention.

FIG. 8 is an exemplary diagram of a structure of a parity check matrix H expressed as a format of a base matrix $H_b$ according to another preferred embodiment of the present invention.

Different from the examples shown in FIGS. 4 to 7, an example shown in FIG. 8 is configured to have no sub-matrix generated from rotating an identity matrix by 90° and to make a 6-cycle not exist on the assumption that every identity matrix of $(H_b)_p$ is '1' by taking the base matrix $H_b$ as a reference.

An encoding process using the parity matrix H shown in FIG. 8 is carried out by two procedures of recursion and finalization according to Equation 11 and Equation 12, respectively.

$$p(i) = p(i-1) + \sum_{j=0}^{k_b-1} P_{i,j} s(j), \quad \text{[Equation 11]}$$

$$i = 0, 1, \ldots, m_b - 5,$$

$$\text{where } p(-1) \equiv 0_{z \times 1}$$

Equation 11 explains a procedure of sequentially obtaining a first parity vector $p(0)$ to a parity vector $p(m_b-5)$ corresponding to a sixth one from a last one through simple recursive calculations.

$$p(m_b - 2) = p(m_b - 5) + \sum_{i=m_b-5}^{m_b-1} \sum_{j=0}^{k_b-1} P_{i,j} s(j), \quad \text{[Equation 12]}$$

$$\sum_{j=m_b-5}^{m_b-1} P_{i, k_b + j}\, p(j) = \sum_{j=0}^{k_b-1} P_{i,j} s(j),$$

$$i = m_b - 1,$$

$$m_b - 3,$$

$$\text{and } m_b - 4$$

The finalization procedure is to find $p(m_b-4)$, $p(m_b-3)$, $p(m_b-2)$ and $p(m_b-1)$, through which five last parity vectors can be obtained for finalization of encoding.

Figure 9:
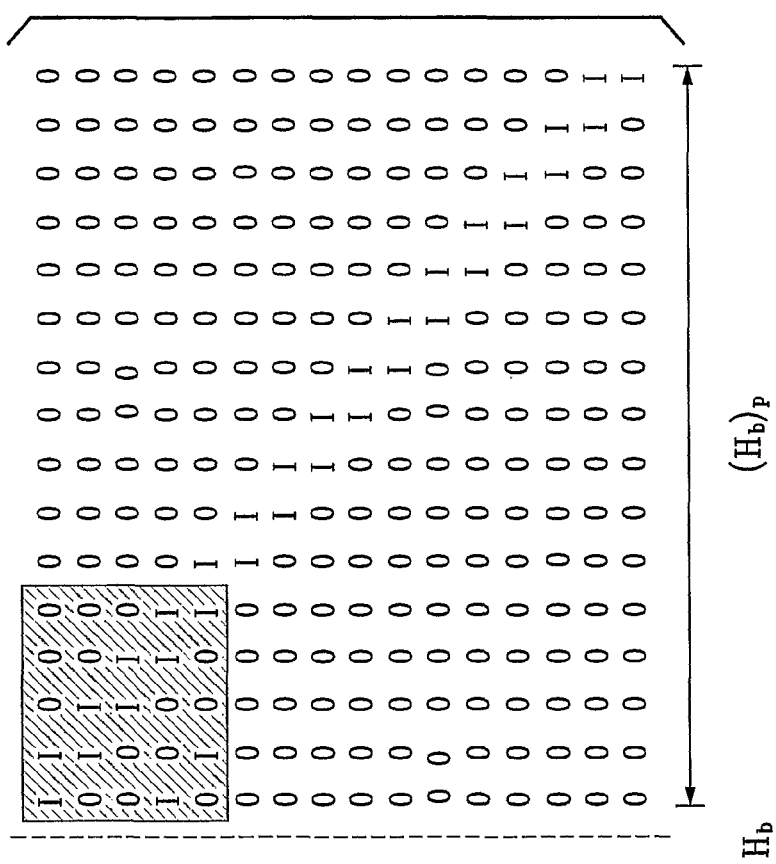
FIG. 9 is an exemplary diagram of a structure of a parity check matrix H expressed as a format of a base matrix $H_b$ according to another preferred embodiment of the present invention.

FIG. 9 is an exemplary diagram of a structure of a parity check matrix H expressed as a format of a base matrix $H_b$ according to another preferred embodiment of the present invention.

Similar to the example shown in FIG. 8, an example shown in FIG. 9 is configured to have no sub-matrix generated from rotating an identity matrix by 90° and to make a 6-cycle not exist on the assumption that every identity matrix of $(H_b)_p$ is '1' by taking the base matrix $H_b$ as a reference.

An encoding process using the parity matrix H shown in FIG. 9 is carried out by two procedures of recursion and finalization according to Equation 13 and Equation 14, respectively. The meanings of Equation 13 and Equation 14 are similar to those of Equation 11 and Equation 12.

$$p(i) = p(i+1) + \sum_{j=0}^{k_b-1} P_{i,j}s(j),$$ [Equation 13]

$i = m_b - 1, \ldots, 6, 5,$ where $p(m_b) \equiv 0_{z \times 1}$ $$p(1) = p(5) + \sum_{i=0}^{4} \sum_{j=0}^{k_b-1} P_{i,j}s(j),$$ [Equation 14]

$$\sum_{j=0}^{4} P_{i,k_b+j}p(j) = \sum_{j=0}^{k_b-1} P_{i,j}s(j),$$

$i = 0, 2, 3, 4$

In receiving to decode the data encoded in the above manner, the receiver 30 in FIG. 3 uses Equation 15.

$H \cdot x = 0$ [Equation 15]

Namely, if '0' results from multiplying the encoded data x by the parity check matrix H, it means there is no transmission error. If it is not zero, it means that there exists a transmission error. So, the source data can be extracted correspondingly.

The parity check matrices H according to the formats of the base matrix $H_b$ in FIGS. 4 to 7 are just exemplary structures to explain the preferred embodiments of the present invention. A size of a parity check matrix H substantially used in encoding or decoding is considerably big. And, the part $H_p$ is improved from the parity check matrix H having the configuration of $H=[H_d \: H_p]$. Hence, it is apparent that the part $H_d$ can be variously configured.

In substantially performing the encoding or decoding using the LDPC code defined by the parity check matrix H, each time the encoding or decoding is needed while the permutation types of the base permutation matrix and a plurality of the permutation matrices generated from permutating the base permutation matrix according to a predetermined regularity, the parity check matrix H is generated from expanding the base matrix $H_b$. And, it is preferable that the encoding or decoding is carried out using the generated parity check matrix.

Therefore, by making the $H_p$ of the parity check matrix H avoid the column having the weight of 1, the present invention can perform the encoding or decoding through the simple recursive operation. Hence, the present invention lowers the initialization complexity in the encoding or decoding using the LDPC code, thereby enhancing the performance.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

INDUSTRIAL APPLICABILITY

Accordingly, the present invention is applicable to such a wireless communication system as a mobile communication system, a broadband wireless access system and the like and is further applicable to all kinds of fields needing the encoding or decoding.

The invention claimed is:

1. A method of encoding data using an (n−k)×n parity check matrix H, the method comprising;
   providing source data to be encoded using the parity check matrix H; and
   encoding the source data using the parity check matrix H in order to output a codeword, the parity check matrix H including $H_p$ and $H_d$ to satisfy $H=[H_d | H_p]$, wherein $H_d$ has (n−k)×k dimensions and $H_p$ has (n−k)×(n−k) dimensions,
   wherein $H_p$ comprises a plurality of z×z sub-matrices and each of the plurality of sub-matrices is an identity matrix or a zero matrix,
   wherein a column weight of each column of $H_p$ is at least two, and
   wherein $H_p$ further includes at least one sub-matrix generated by rotating the identity matrix by 90°.

2. The method of claim 1, wherein the parity check matrix H does not have a 4-cycle overall.

3. The method of claim 1, wherein a 6-cycle for the entire parity check matrix H is equal to or smaller than a preset critical value ($C_{max}$).

4. The method of claim 1, wherein encoding the source data comprises:
   a recurring step of sequentially determining a first parity vector p(0) to a fourth parity vector $p(m_b-4)$ corresponding to a fourth parity vector from the last; and
   a final step of determining $p(m_b-3)$, $p(m_b-2)$ and $p(m_b-1)$.

5. The method of claim 4, wherein the recurring step is performed by an equation:

$$p(i) = p(i-1) + \sum_{j=0}^{k_b-1} P_{i,j}s(j),$$

$i = 0, 1, \ldots, m_b - 6,$ where $p(-1) \equiv 0_{z \times 1}$.

6. The method of claim 5, wherein the final step is performed by equations:

$$P_{m_b-3,n_b-3}p(m_b-3) = p(m_b-4) + \sum_{i=m_b-3}^{m_b-1} \sum_{j=0}^{k_b-1} P_{i,j}s(j),$$

$$p(i) = p(m_b-3) + \sum_{j=0}^{k_b-1} P_{i,j}s(j), i = m_b - 2, m_b - 1.$$

7. The method of claim 5, wherein the final step is performed by equations:

$$P_{m_b-3,n_b-2}p(m_b-2) = p(m_b-4) + \sum_{i=m_b-3}^{m_b-1} \sum_{j=0}^{k_b-1} P_{i,j}s(j),$$

$$p(i) = p(m_b-2) + \sum_{j=0}^{k_b-1} P_{i,j}s(j), i = m_b - 3, m_b - 1.$$

8. The method of claim 1, wherein encoding the source data comprises:
  an initial step of sequentially determining a fourth parity vector p(4) to an $m_b^{th}$ parity vector p($m_b$); and
  a final step of determining p(0), p(1) and p(2).

9. The method of claim 8, wherein the initial step is performed by an equation:

$$p(i-1) = p(i) + \sum_{j=0}^{k_b-1} P_{i,j} s(j),$$

$i = 4, 5, \ldots, m_b$, where $p(m_b) \equiv 0_{z\times 1}$.

10. The method of claim 9, wherein the final step is performed by equations:

$$P_{2,0} p(0) = p(3) + \sum_{i=0}^{2} \sum_{j=0}^{k_b-1} P_{i,j} s(j),$$

$$p(i) = p(0) + \sum_{j=0}^{k_b-1} P_{i,j} s(j), \; i = 1, 2.$$

11. The method of claim 9, wherein the final step is performed by equations:

$$P_{3,2} p(1) = p(3) + \sum_{i=0}^{2} \sum_{j=0}^{k_b-1} P_{i,j} s(j),$$

$$p(i) = p(1) + \sum_{j=0}^{k_b-1} P_{i,j} s(j), \; i = 0, 3.$$

* * * * *